United States Patent [19]

Takahashi et al.

[11] Patent Number: 5,287,323
[45] Date of Patent: Feb. 15, 1994

[54] SEMICONDUCTOR MEMORY DEVICE

[75] Inventors: Makoto Takahashi; Toshinari Takayanagi, both of Yokohama, Japan

[73] Assignee: Kabushiki Kaisha Toshiba, Kanagawa, Japan

[21] Appl. No.: 834,231

[22] PCT Filed: Jun. 26, 1991

[86] PCT No.: PCT/JP91/00858

§ 371 Date: Mar. 18, 1992

§ 102(e) Date: Mar. 18, 1992

[30] Foreign Application Priority Data

Jun. 27, 1990 [JP] Japan ................... 2-166615

[51] Int. Cl.⁵ .............................................. G11C 7/00
[52] U.S. Cl. ............................ 365/230.05; 365/154; 365/189.07
[58] Field of Search .......... 365/154, 156, 190, 230.05, 365/189.07, 189.09, 226

[56] References Cited

U.S. PATENT DOCUMENTS 4,764,899 8/1988 Hewallen et al. .............. 365/190 X

FOREIGN PATENT DOCUMENTS 60-103583 6/1985 Japan .
61-54096 3/1986 Japan .
1-122093 5/1989 Japan .
1-178193 7/1989 Japan .
1-285088 11/1989 Japan .

Primary Examiner—Joseph A. Popek
Attorney, Agent, or Firm—Finnegan, Henderson, Farabow, Garrett & Dunner

[57] ABSTRACT

The invention relates to a multi-port memory, wherein data is written into, and read from, a memory cell in multi-port scheme. The memory is designed to solve the problem that the data-writing speed decreases when data-writing and data-reading with respect to the same memory cell conflict with each other. To solve the problem, when data-writing and data-reading with respect to the same memory cell (102) conflict with each other, a bit-line load control circuit (130) is connected, in accordance with address signals and write-enable signals, to bit lines (BLa, /BLa, BLb, /BLb) for selecting the memory cell (102) and turns off bit-line load circuits (117, 127) for supplying a predetermined potential to the bit lines (BLa, /BLa, BLb, /BLb), thereby preventing the data-reading speed from decreasing.

5 Claims, 7 Drawing Sheets

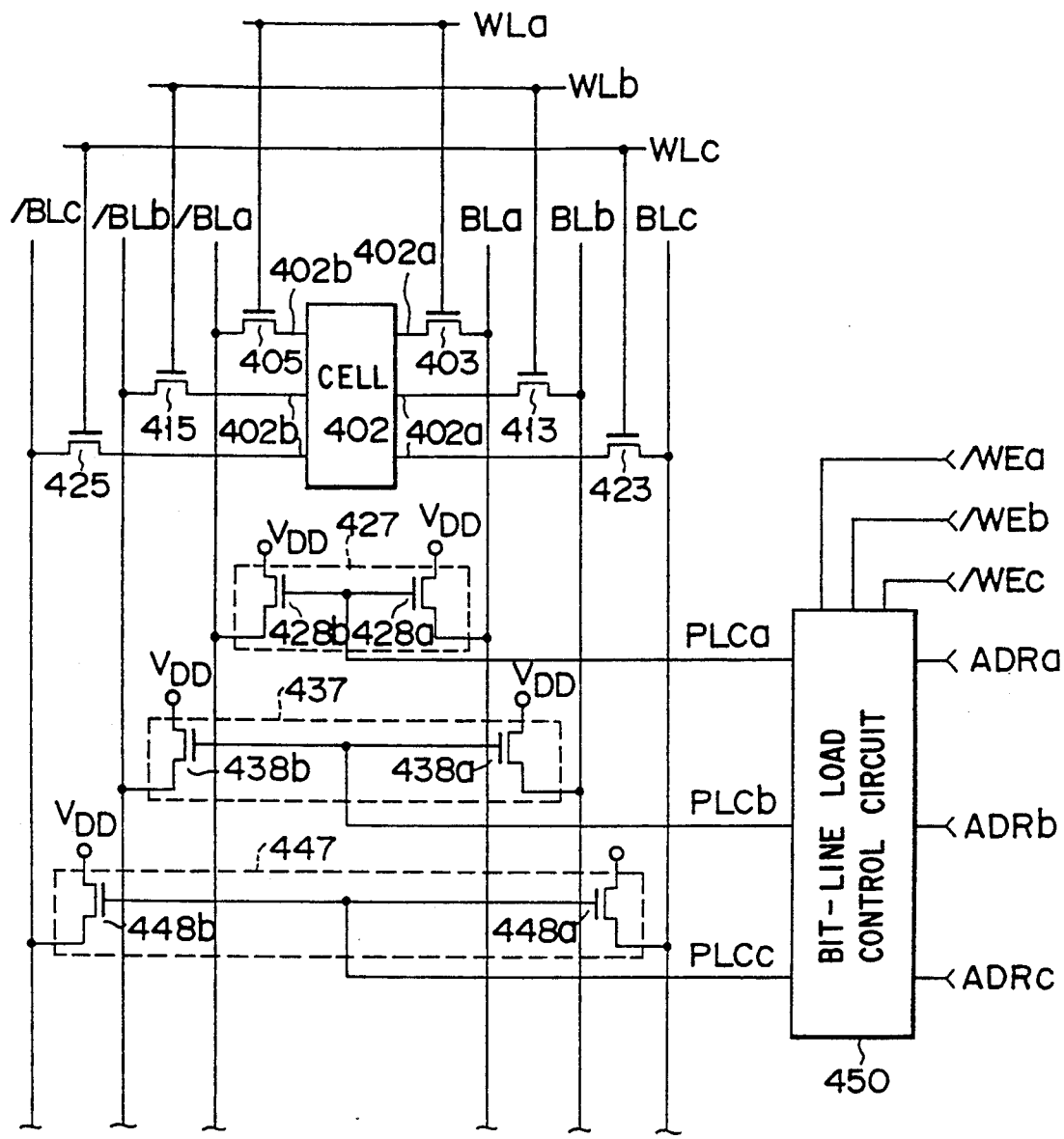
F I G. 4

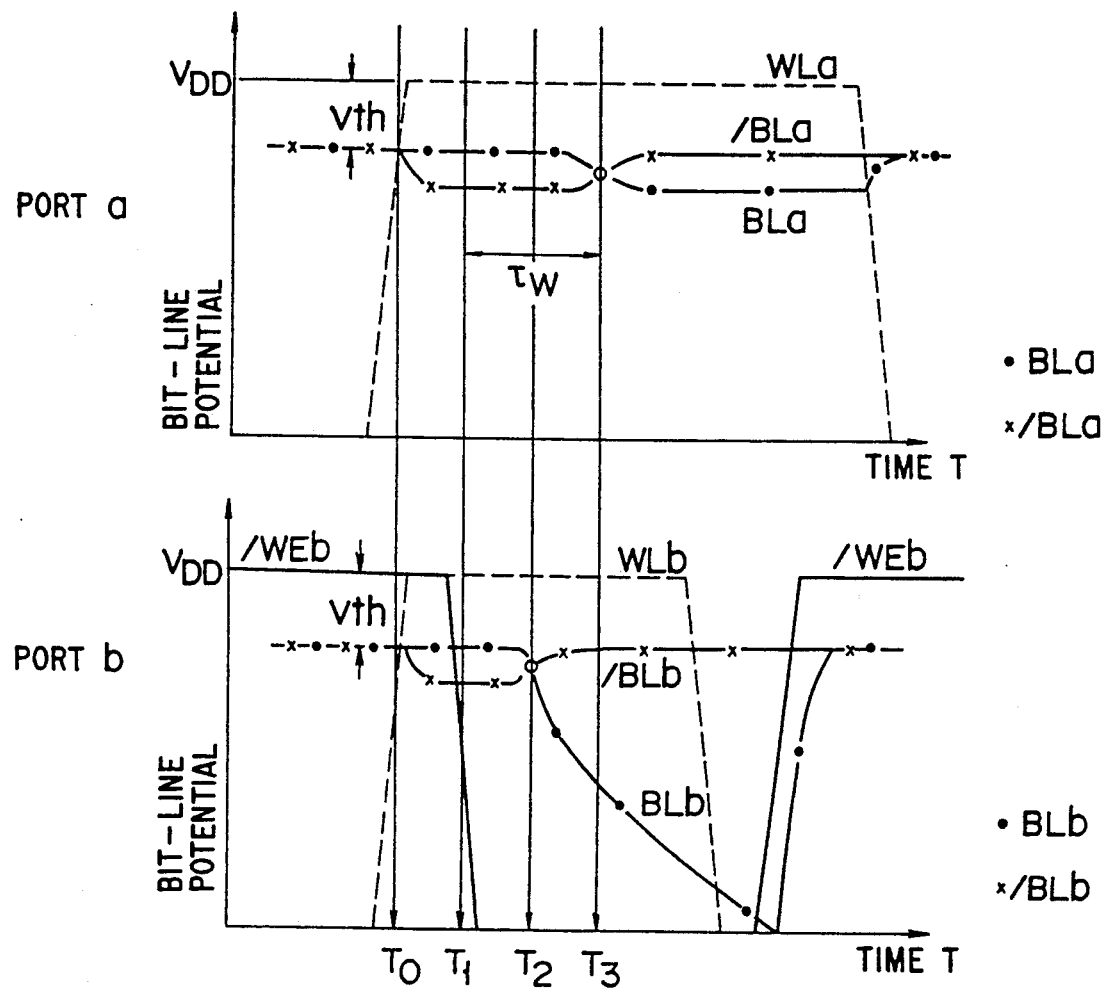
F I G. 7

SEMICONDUCTOR MEMORY DEVICE

TECHNICAL FIELD

The present invention relates to, for example, a static memory, and more particularly to a semiconductor memory device which has a multi-port function.

BACKGROUND ART

Generally, a multi-port memory is used as a cache memory which functions as a memory common to the CPUs incorporated in a multi CPU system, or as an image memory in which the same address must be accessed at the same time. A plurality of word lines and a plurality of bit lines are connected to each memory cell of the multi-port memory. If data is written into any memory cell, while other data is being read from the same memory cell, the data read from the memory cell may not remain identical to the data stored in the cell before the reading of data. Hence, the processor or the like incorporated in the system usually reforms control, so that the data-writing and the data-reading may not conflict with each other.

In a system wherein data-writing and data-reading can be simultaneously performed on the same cell, any data is read from the cell after the data has been written into the cell, whereby the data remains identical. In this case, however, the read-access time increases. To avoid an increase in the read-access time, a method is employed in which the data to be read is bypassed to the bit line of a readout port or to the output of a sense amplifier.

FIG. 6 is a circuit diagram showing a conventional 2-port memory device.

Opposing data items are stored in a memory cell 602. One of the data items stored in the memory cell 602 are output to a bit line BLa via a transfer gate 603 in accordance with the potential of a word line WLa. The inverted data item stored in the memory cell 602 is output to a bit line /BLa through a transfer gate 605 in accordance with the potential of a word line WLa. In accordance with the potential of a word line WLb, the data stored in the memory cell 602 is output to a bit line BLb through a transfer gate 613 in accordance with the potential of a word line WLb, and the data inverted with respect to this data is transferred from the memory cell 602 to a bit line /BLb through a transfer gate 615.

Bit-line load circuits 617 and 627 designed for holding the potentials of the bit lines at power-supply potential $V_{DD}$ are connected between the bit lines BLa and /BLa and between the bit lines BLb and /BLb, respectively. More specifically, the current paths of the MOS transistors 618a and 618b forming the bit-line load circuit 617 are connected, at one end, to the bit lines BLa and /BLa and, at the other end, to the power-supply potential $V_{DD}$. A write-enable signal /WEa is supplied to the gates of these MOS transistors 618a and 618b. The MOS transistors 628a and 628b constituting the bit-line load circuit 627 are connected, at one end, to the bit lines BLb and /BLb and, at the other end, to the power-supply potential $V_{DD}$. A write-enable signal /WEb is supplied to the gates of these MOS transistors 628a and 628b.

Hereinafter, the input/output path using the bit lines BLa and /BLa shall be called "port a," and the input/output path using the bit lines BLb and /BLb shall be called "port b." When the write-enable signal /WEa for the port a is input to the gates of the MOS transistors 618a and 618b of the bit-line load circuit 617, and the port a is not used for writing data, the potentials of the bit lines BLa and /BLa are held at the power-supply potential $V_{DD}$. Similarly, when the write-enable signal /WEb for the port b is input to the gates of the MOS transistors 628a and 628b of the bit-line load circuit 627, and the port b is not used for writing data, the potentials of the bit lines BLb and /BLb are held at the power-supply potential $V_{DD}$.

The data-reading through the port a and the data-writing through the port b may conflict with each other, with respect to the memory cell 602. In this case, the bit-line load circuit 617 of the port a may delay the data-writing into the cell, or may render it impossible to write data thereinto at all. This is not only because the data the memory cell 602 latches is rewritten, but also because the data on the bit lines of the part a, i.e., the data-reading side at which the bit-line load circuit 617 remains on, is inverted. The more ports provided, the more prominent this problem is.

If data is read out after the delayed writing of the data described above, it is natural that much time is required to read the data. If no data can be written, it is can no longer be guaranteed that the data read out is identical to the data written.

As is shown in the figure, the memory cell 602 is an E/R-type cell which comprises an enhancement-type MOS transistor and a resistor. In the case where the memory cell is a full CMOS cell which comprises a CMOS only, the memory cell can hold data more stably than an E/R-type cell, and the problem described above is more acute.

FIG. 7 is a diagram explaining how the potentials of the bit lines BLa, /BLa, BLb, and /BLb change when the data-reading through the port a and the data-writing through the port b conflict with respect to the memory cell of the conventional memory device.

With reference to FIGS. 6 and 7, it will now be described how the potential of each bit line changes when the data-reading and the data-writing conflict with each other. Here it is assumed that, before time $T_0$, the first memory node 650 connected to the transfer gates 605 and 515 of the memory cell 602 are at a low level "L," and the second memory node 660 connected to the transfer gates 603 and 613 are at a high level "H." Also, before time $T_0$, the potential of each bit line is the difference between the power-supply potential $V_{DD}$ and the threshold voltage $V_{th}$ of the MOS transistors of the bit-line load circuit.

First, at time $T_0$, the potentials of the word lines WLa and WLb rise, whereby the transfer gates are operated. Then, a current path is formed between the memory cell 602 and the bit lines BLa and /BLa, and a current path is formed between the memory cell 602 and the bit lines BLb and /BLb. The potentials of the bit lines /BLa and /BLb are thereby lowered to the low level, whereby a potential difference occurs between the bit lines BLa and BLb.

Next, at time $T_1$, the write-enable signal /WEb falls, and the writing of data is started. Then, until the signal /WEb rises again, the bit-line load circuit 627 of the port b remains off. Thereafter, at time $T_2$, the potential of the bit line BLb and that of the bit line /BLb are inverted due to the data-writing operation. Then, at time $T_3$, the potential of the bit line BLa and that of the bit line /BLa are inverted. $T_3 - T_1 = \tau W$, where $\tau W$ is the period between the rising of the write-enable signal /WEb and the completion of inversion of the bit-line potentials of both ports. In the circuit shown in FIG. 6, the reading of data is effected at the same time as the writing of data, and the bit lines of the port a, whose bit-line load circuit 617 is on, are driven Hence, the data-writing period $\tau W$ is long.

DISCLOSURE OF INVENTION

The object of the present invention is to provide a semiconductor memory device which is of multi-port type and can perform data-writing and data-reading with reliability and at high speed.

According to the invention, there is provided a semiconductor memory device which comprises:
- memory means for storing data statically;
- first transfer means for transferring the data stored in the memory means to a first bit line, in accordance with the potential of a first word line;
- a second transfer means for transferring the data stored in said memory means to a second bit line, in accordance with the potential of a second word line;
- potential-holding means connected between said first and second bit lines, on the one hand, and a power-supply potential, for holding the potentials of the bit lines at the power-supply potential; and
- potential-holding control means for controlling the potential-holding means in accordance with a plurality of address signals and a plurality of control signals.

Namely, in the present invention, when the writing of data and the reading of data conflict with respect to one memory cell, the potential-holding control means stops the potential-holding means such as bit-line load circuit. Therefore, the time required for inverting the potentials of the bit lines is thereby shortened, thus reducing the data-writing time.

BRIEF DESCRIPTION OF DRAWINGS

FIG. 4 is a circuit diagram showing a 3-port memory which is a second embodiment of the present invention;

FIG. 7 is a diagram explaining how the potential of each bit line of the conventional 2-port memory changes.

BEST MODE OF CARRYING OUT THE INVENTION

An embodiment of this invention will now be described, with reference to the accompanying drawings.

Figure 1:
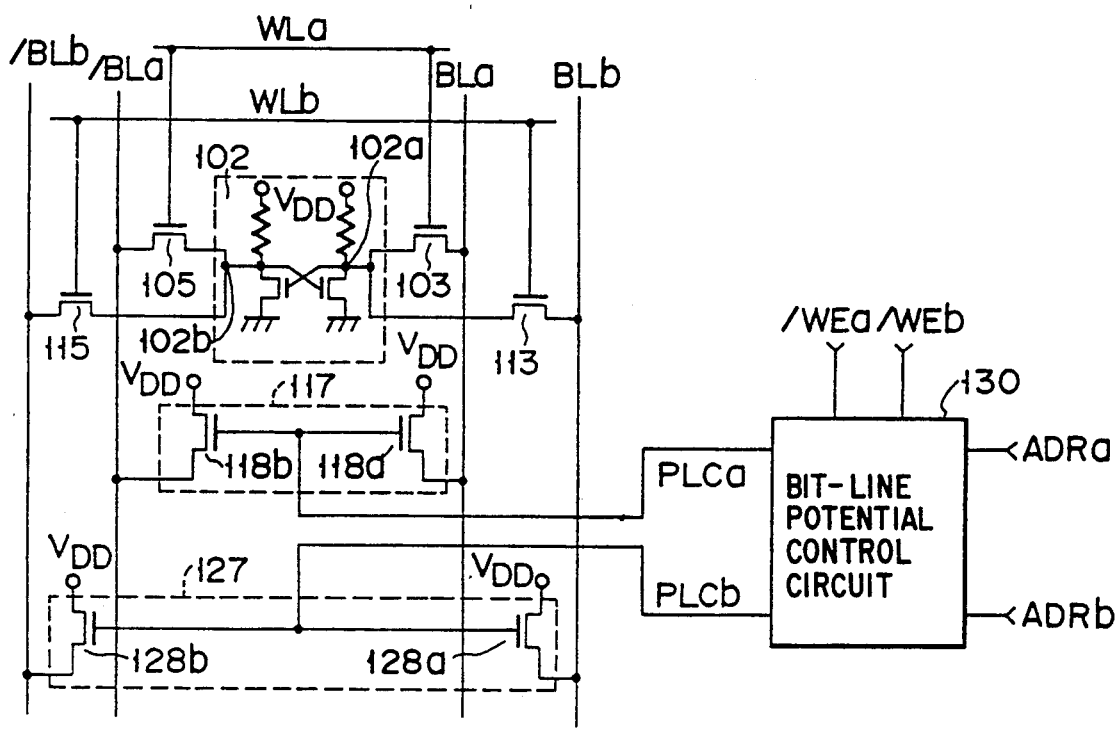
FIG. 1 is a circuit diagram showing a 2-port memory according to a first embodiment of the present invention.

FIG. 1 shows a first embodiment of the invention, or the structure of a 2-port memory.

A memory cell 102, for example, a static memory, comprises, for example, a pair of enhancement-type MOS transistors and a pair of resistors. The first memory node 102a of this memory cell 102 is connected to a bit line BLa by a transfer gate 103 which is made of an MOS transistor. The gate of the transfer gate 103 is connected to a word line WLa. The second memory node 102b of the memory cell 102 is connected to a bit line /BLa by a transfer gate 105 which is made of a MOS transistor. The gate of the transfer gate 105 is connected to a word line WLa.

The first memory node 102a of the memory cell 102 is also connected to a bit line BLb by a transfer gate 113 which is made of a MOS transistor. The gate of the transfer gate 113 is coupled to a word line WLb. The second memory node 102b of the memory cell 102 is connected to a bit line /BLb by a transfer gate 115 which is made of a MOS transistor. The gate of the transfer gate 115 is coupled to a word line WLb.

A bit-line load circuit 117 is provided between the bit line BLa and the bit line /BLa, for maintaining the potentials of these bit lines at a power-supply potential. The bit-line load circuit 117 comprises MOS transistors 118a and 118b. The current path of the MOS transistor 118a is connected, at one end, to a power-supply $V_{DD}$ and, at the other end, to the bit line BLa. The current path of the MOS transistor 118b is connected, at one end, to the power supply $V_{DD}$ and, at the other end, to the bit line /BLa.

A bit-line load circuit 127 is provided between the bit line BLb and the bit line /BLb, for maintaining the potentials of these bit lines at the power-supply potential. The bit-line load circuit 127 comprises MOS transistors 128a and 128b. The current path of the MOS transistor 128a is connected, at one end, to a power-supply $V_{DD}$ and, at the other end, to the bit line BLb. The current path of the MOS transistor 128b is coupled, at one end, to the power supply $V_{DD}$ and, at the other end, to the bit line /BLb.

The gates of the MOS transistors 118a and 118b, and those of the MOS transistors 128a and 128b are connected to the output terminal of a bit-line load control circuit 130, which will be described later.

The memory cell 102 stores data items opposite to each other. These data items stored are transferred to the bit lines BLa and /BLa through the transfer gates 103 and 105, in accordance with the potential of the word line WLa. The data items stored in the memory cell 102 are also transferred to the bit lines BLb and /BLb through the transfer gates 113 and 115, in accordance with the potential of the word line WLb. Hereinafter, the input/output path using the bit lines BLa and /BLa shall be called "port a," and the input/output path using the bit lines BLb and /BLb shall be called "port b."

The bit-line load control circuit 130 receives the address signal ADRa for the port a, the address signal ADRb for the port b, a write-enable signal WEa for the port a, and a write-enable signal /WEb for the port b. The output signal PLCa of the bit-line load control circuit 130 is supplied to the gates of the MOS transistors 118a and 118b, and the output signals PLCb thereof is supplied to the gates of the MOS transistors 128a and 128b.

Figure 2:
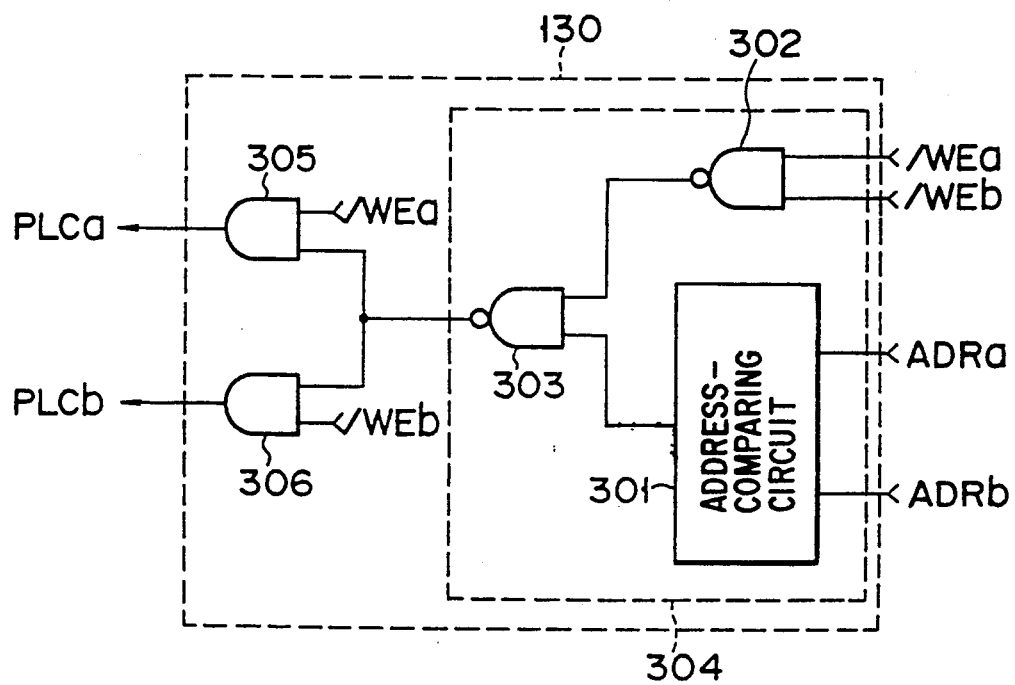
FIG. 2 is a circuit diagram explaining a bit-line load control circuit for use in the 2-port memory.

FIG. 2 shows the structure of the bit-line load control circuit for 130. The bit-line load control circuit 130 includes a write/read conflict detecting circuit 304. In the write/read conflict detecting circuit 304, an address-comparing circuit 301 comprises an exclusive NOR gate which has the same number of inputs as the number of bits of the address. This address-comparing circuit 301 compares the address signal ADRa for the port a with the address signal ADRb for the port b. The write-enable signals /WEa and /WEb are input to the input terminals of a NAND circuit 302. The output signal of the NAND circuit 302 and the output signals of the address-comparing circuit 301 are input to an NAND circuit 303. The output signal of the NAND circuit 303 is supplied to one of the inputs terminals of an AND circuit 305, and also to one of the input terminals of an AND circuit 306 The write-enable signal /WEa is supplied to the other input terminal of the AND circuit 305, and the write-enable signal /WEb is supplied to the other input terminal of the AND circuit 306. The AND circuit 305 outputs the output signal PLCa, and the AND circuit 306 outputs the output signal PLCb. The use of this bit-line load control circuit 130 prevents an increase in the data-writing time and disagreement between the data written and the data read out, even if the data-writing into a memory cell through part a conflicts with the data-reading from the same memory cell through the port b.

It will now be explained how data is written through the port a into the memory cell, and how data is read from the same memory cell through the port b, in the structure described above.

First, when the address-comparing circuit 301 of the bit-line load control circuit 130 detects that the address signal ADRa coincides with the address signal ADRb, the address-comparing circuit 301 output a high-level signal. At the same time, the NAND circuit 302 outputs a high-level signal if either the write-enable signal /WEa for the port a or the write-enable signal WEb for the port b is at the low level and is hence active. The NAND circuit 303, therefore, outputs a low-level signal, whereby the AND circuits 305 and 306 outputs signals PLCa and PLCb, both being at the low level. The MOS transistors 118a and 118b and the MOS transistors 128a and 128b are thereby turned off. As a result of this, the data-writing time does not become long, nor does it become impossible to write data. This is because the bit-line load circuit 127 does not prevent data-writing to the cell 102.

In order to accomplish data-writing only by means of one of the ports, the bit-line load control circuit 130 sets only the bit-line load circuit of the data-writing port in inoperative condition. During the data-reading, none of the bit-line load circuits are set in inoperative condition.

Figure 3:
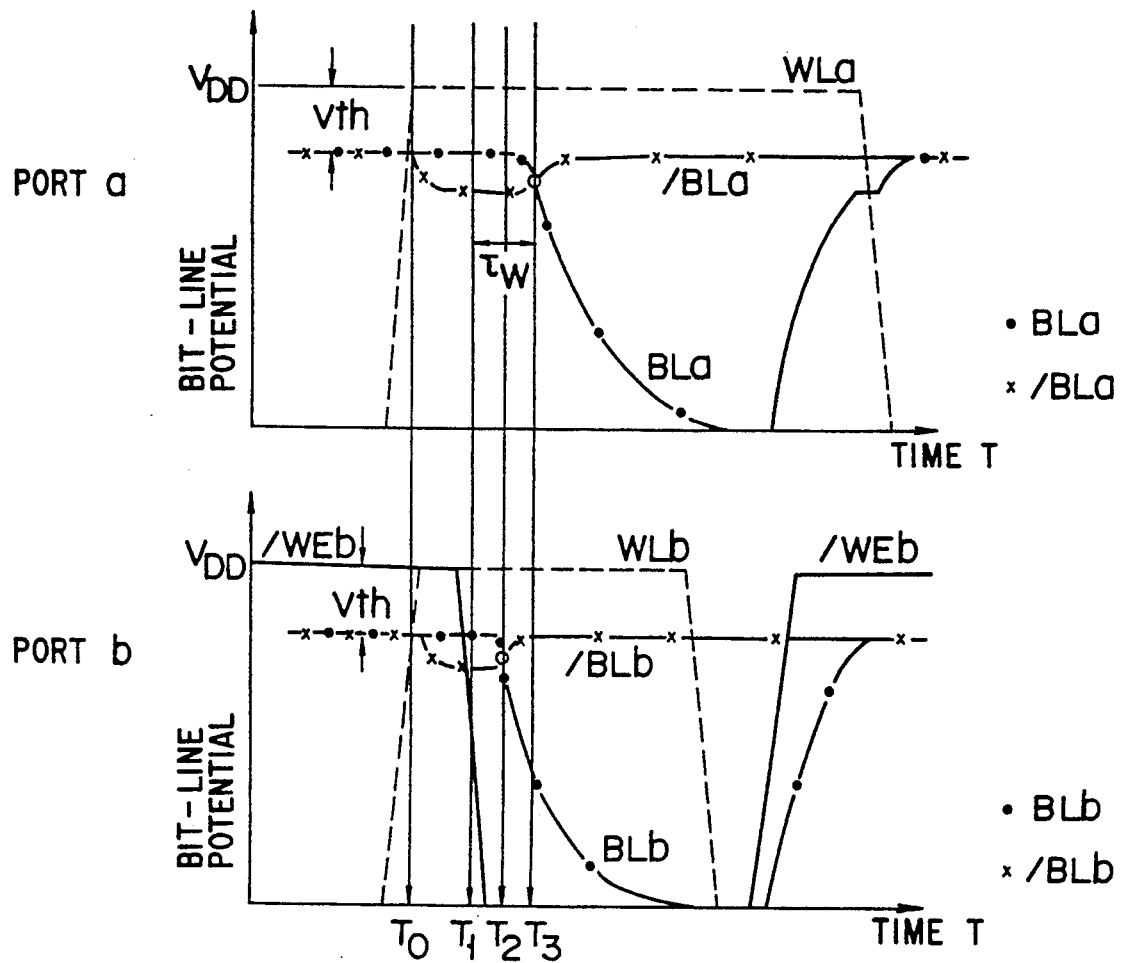
FIG. 3 is a diagram explaining how the potential of each bit line incorporated in the 2-port memory according to the invention changes.

FIG. 3 is a diagram explaining how the potentials of the bit lines BLa, /BLa, BLb and /BLb change in the 2-port memory of the invention when the data-writing being achieved by the port a conflicts with the data-reading being performed by the port b. In FIG. 3, before time $T_0$, the potential of each bit line is the difference between the power-supply potential $V_{DD}$ and the threshold voltage Vth of the MOS transistors of the bit-line load circuits.

In FIG. 3, too, the potential of each bit line changes at times $T_0$, $T_1$, $T_2$, and $T_3$ in the same way as in the conventional 2-port memory as is illustrated in FIG. 7.

In the present invention, however, the period $\tau W$ ($T_3 - T_1$) is shorter than in the conventional memory (see FIG. 7), said period $\tau W$ elapsing until time $T_3$ when the potentials of the bit lines BLa and /BLa are inverted, thereby completing the data-writing. This is because the period between time $T_1$ when the write-enable signal /WEb rises and time $T_2$ when the potentials of the bit lines BLb and /BLb are inverted, and also because the period between time $T_2$ when the potentials of the bit lines BLb and /BLb are inverted and time $T_3$ when the potentials of the bit lines BLa and /Bla are inverted, thus completing the potential inversion of the bit lines of both ports.

FIG. 4 shows a second embodiment of the invention, which is applied to a 3-port memory.

In FIG. 4, as in the embodiment of FIG. 1, the first memory node 402a of a memory cell 402, which comprises, for example, a static memory, is connected to a bit line BLa by a transfer gate 403 which is made of an MOS transistor. The gate of the transfer gate 403 is coupled to a word line WLa. The second memory node 402b of the memory cell 402 is connected to a bit line /BLa by a transfer gate 405 which is made of a MOS transistor. The gate of the transfer gate 405 is connected to a word line WLa.

The first memory node 402a of the memory cell 402 is also connected to a bit line BLb by a transfer gate 413 which is made of a MOS transistor. The gate of the transfer gate 413 is coupled to a word line WLb. The second memory node 402b of the memory cell 402 is connected to a bit line /BLb by a transfer gate 415 which is made of a MOS transistor. The gate of the transfer gate 415 is coupled to a word line WLb.

Further, the first memory node 402a of the memory cell 402 is connected to a bit line BLc by a transfer gate 423 which is made of a MOS transistor. The gate of the transfer gate 423 is coupled to a word line WLc. The second memory node 402b of the memory cell 402 is connected to a bit line /BLc by a transfer gate 425 which is made of a MOS transistor. The gate of the transfer gate 425 is coupled to a word line WLc.

A bit-line load circuit 427 is provided between the bit line BLa and the bit line /BLa, for maintaining the potentials of these bit lines at a power-supply potential. The bit-line load circuit 117 comprises MOS transistors 428a and 428b. The current path of the MOS transistor 428a is connected, at one end, to a power-supply $V_{DD}$ and, at the other end, to the bit line BLa. The current path of the MOS transistor 428b is coupled, at one end, to the power supply $V_{DD}$ and, at the other end, to the bit line /BLa.

A bit-line load circuit 437 is provided between the bit line BLb and the bit line /BLb, for maintaining the potentials of these bit lines at the power-supply potential. The bit-line load circuit 437 comprises MOS transistors 438a and 438b. The current path of the MOS transistor 438a is connected, at one end, to a power-supply $V_{DD}$ and, at the other end, to the bit line BLb. The current path of the MOS transistor 438b is coupled, at one end, to the power supply $V_{DD}$ and, at the other end, to the bit line /BLb.

A bit-line load circuit 447 is provided between the bit line BLc and the bit line /BLc, for maintaining the potentials of these bit lines at the power-supply potential. The bit-line load circuit 437 comprises MOS transistors 448a and 448b. The current path of the MOS transistor 448a is connected, at one end, to a power-supply $V_{DD}$ and, at the other end, to the bit line BLc. The current path of the MOS transistor 448b is coupled, at one end, to the power supply $V_{DD}$ and, at the other end, to the bit line /BLc.

The gates of the MOS transistors 428a and 428b, those of the MOS transistors 438a and 438b, and those of the MOS transistors 448a and 448b are connected to the output terminal of a bit-line load control circuit 450, which will be described later.

The memory cell 402 stores data items opposite to each other. These data items stored are transferred to the bit lines BLa and /BLa through the transfer gates 403 and 405, in accordance with the potential of the word line WLa. The data items opposite to each other and stored in the memory cell 402 are also transferred to the bit lines BLb and /BLb through the transfer gates 413 and 415, in accordance with the potential of the word line WLb. Further, the data items opposite to each other and stored in the memory cell 402 are also transferred to the bit lines BLc and /BLc through the transfer gates 423 and 425, in accordance with the potential of the word line WLc.

Hereinafter, the input/output path using the bit lines BLa and /BLa shall be called "port a," the input/output path using the bit lines BLb and /BLb shall be called "port b," and the input/output path using the bit lines BLc and /BLc shall be called "port c."

The bit-line load control circuit 450 receives the address signal ADRa for the port a, the address signal ADRb for the port b, the address signal ADRc for the port c, a write-enable signal WEa for the port a, a write-enable signal /WEb for the port b, and a write-enable signal /WEc for the port c. The output signal PLCa of the bit-line load control circuit 450 is supplied to the gates of the MOS transistors 428a and 428b, the output signals PLCb thereof is supplied to the gates of the MOS transistors 438a and 438b, and the output signal PLCc thereof is supplied to the gates of the MOS transistors 448a and 448b.

Figure 5:
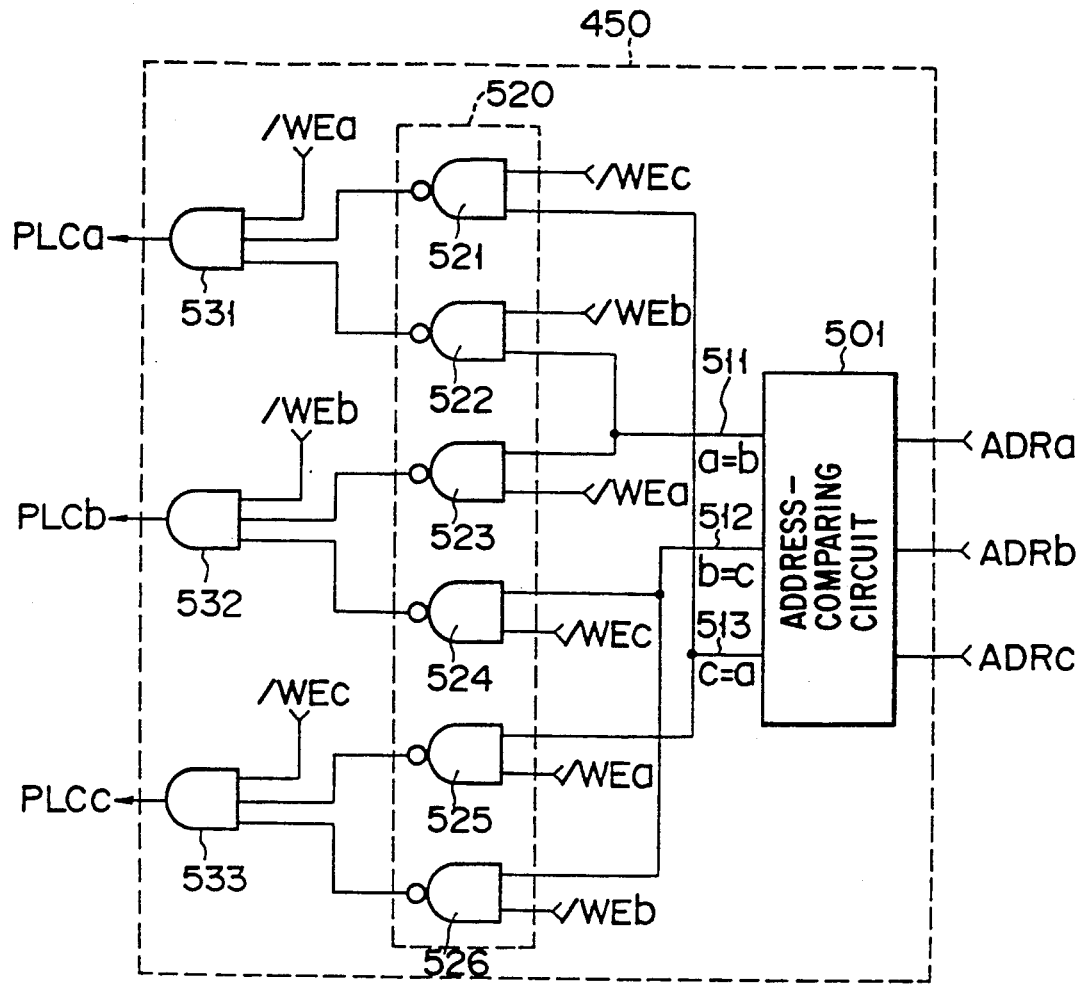
FIG. 5 is a circuit diagram explaining a bit-line load control circuit for use in a 3-port memory.
Figure 6:
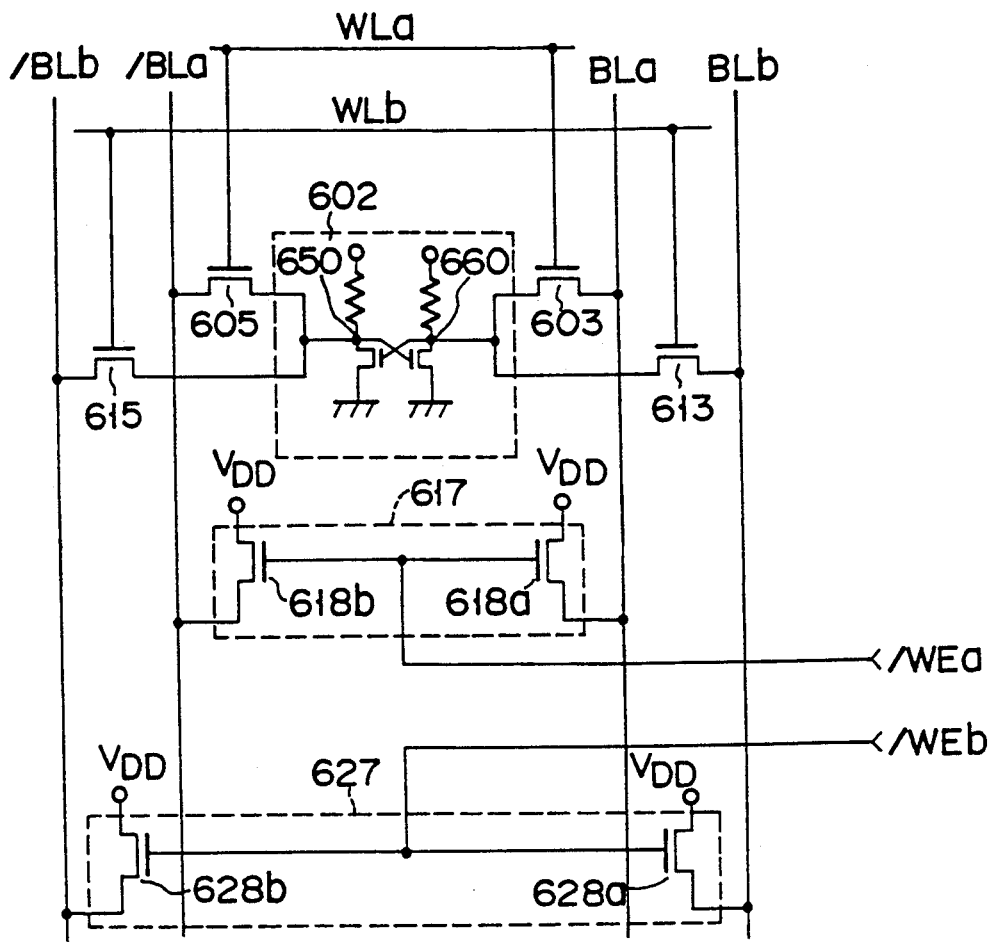
FIG. 6 is a circuit diagram showing the structure of a conventional 2-port memory.

FIG. 5 shows the structure of the bit-line load control circuit for 450. In the bit-line load control circuit 450, an address-comparing circuit 501 comprises an exclusive NOR gate which has the same number of inputs as the number of bits of the address. The address-comparing circuit 501 compares the address signals ADRa, ADRb and ADRc for the ports a, b and c, respectively. When the address signals ADRa and ADRb coincide with each other, the circuit 501 outputs a coincidence signal 511 of "1." When the address signals ADRb and ADRc coincide with each other, the circuit 501 outputs a coincidence signal 511 of "1." When the address signals ADRc and ADRb coincide with each other, the circuit 501 outputs a coincidence signal 513 of "1." NAND circuits 520 receive the write-enable signals /WEa, WEb and /WEc and the coincidence signals 511, 512 and 513. More precisely, the write-enable signal /WEc and the coincidence signal 513 are supplied to the input terminals of a NAND circuit 521. The write-enable signal /WEb and the coincidence signal 511 are supplied to the input terminals of a NAND circuit 522. The write-enable signal /WEa and the coincidence signal 511 are supplied to the input terminals of a NAND circuit 523. The write-enable signal /WEc and the coincidence signal 512 are supplied to the input terminals of a NAND circuit 524. The write-enable signal /WEa and the coincidence signal 513 are supplied to the input terminals of a NAND circuit 525. The write-enable signal /WEb and the coincidence signal 512 are supplied to the input terminals of a NAND circuit 526. The output signals of the NAND circuits 521 and 522 and the write-enable signal /WEa are supplied to the input terminals of an AND circuit 531. The output signals of the NAND circuits 523 and 524 and the write-enable signal /WEb are supplied to the input terminals of an AND circuit 532. The output signals of the NAND circuits 525 and 526 and the write-enable signal /WEc are supplied to the input terminals of an AND circuit 533. The AND circuit 531 outputs a signal PLCa for controlling the bit-line load circuit 427. The AND circuit 532 outputs a signal PLCb for controlling the bit-line load circuit 437. The AND circuit 533 outputs a signal PLCc for controlling the bit-line load circuit 447.

In the second embodiment, too, when the data-writing and the data-reading, which are performed by two or more ports, conflict with each other, with respect to one memory cell, the signals PLCa, PLCb and PLCc output by the bit-line load control circuit 450 stop the bit-line load circuits 427, 437, and 447. Hence, an increase in the data-writing time can be prevented, and disagreement between the data written and the data read out can prevented. Moreover, no such a complex control is required as to output the data to be written, to the bit lines of a data-reading port or a sense amplifier, without supplying the data through the memory cell.

The first and second embodiments, described above, are a 2-port memory and a 3-port memory, respectively. Nonetheless, the number of ports is not limited to these, and the present invention can be applied to a memory having three or more ports. The more ports a multi-port memory has, the more difficult it is to keep the data written and the data read out identical to each other. In view of this, the present invention, if used, is advantageous.

The memory cell is not limited to one having the structure used in the embodiments. Rather, it can comprise CMOS transistors.

Needless to say, the present invention is not limited to the embodiments described above. Various changes and modifications can be made, without departing from the spirit and scope of the present invention.

INDUSTRIAL APPLICABILITY

As has been described in detail, the semiconductor memory device according to this invention, which is of multi-port type, can perform data-writing and data-reading with reliability and at high speed and can, therefore, be greatly useful as as a cache memory, an image memory, or the like.

We claim:
1. A semiconductor memory device comprising:
   memory means for storing data statically;
   a first transfer means for transferring the data stored in said memory means to a first bit line, in accordance with the potential of a first word line;
   a second transfer means for transferring the data stored in said memory means to a second bit line, in accordance with the potential of a second word line;
   potential-holding means connected between said first and second bit lines, on the one hand, and a power-supply potential, for holding the potentials of said bit lines at the power-supply potential; and
   potential-holding control means for controlling said potential-holding means in accordance with a plurality of address signals and a plurality of control signals, said potential-holding control means further including:
   a circuit which generates a signal for turning off said potential-holding means, when said first and second bit lines are selected by an address signal and data-writing is allowed on one of said first and second bit lines, in accordance with a write-enable signal.
2. The semiconductor memory device according to claim 1, wherein said first transfer means comprises an insulated-gate transistor which has a current path connected, at one end, to a memory node of said memory means and, at the other end, to said first bit line, and a gate connected to said first word line.

3. The semiconductor memory device according to claim 1, wherein said second transfer means comprises an insulated-gate transistor which has a current path connected, at one end, to a memory node of said memory means and, at the other end, to said second bit line, and a gate connected to said second word line.

4. The semiconductor memory device according to claim 1, wherein said potential-holding means comprises an insulated-gate transistor which has a current path connected, at one end, to said second bit line and, at the other end, to the power-supply potential, and a gate connected to said potential-holding control means.

5. A semiconductor memory device comprising:
   a memory cell having first and second memory nodes and designed to store data items opposite to each other;
   a first pair of insulated-gate transistors, each of which has a current path and a gate, said current path connected, at one end, to said first and second memory nodes, respectively, and, at the other end, to a first pair of bit lines, respectively, and said each gate being connected to a first word line, said first pair of insulated-gate transistors transferring the opposite data items stored in said memory cell to the bit lines of said first pair, respectively, in accordance with the potential of the first word line;
   a second pair of insulated-gate transistors each of which has a current path and a gate, said current path connected, at one end, to said first and second memory nodes, respectively, and, at the other end, to a second pair of bit lines, respectively, and said each gate being connected to a second word line, said second pair of insulated-gate transistors transferring the opposite data items stored in said memory cell to the bit lines of said second pair, respectively, in accordance with the potential of the second word line;
   third and fourth insulated-gate transistors, each having a current path and a gate, the current paths of the third and fourth insulated-gate transistors being connected, at one end, to the bit lines of said first pair, respectively, and, at the other end, to a power-supply potential;
   fifth and sixth insulated-gate transistors, each having a current path and a gate, the current paths of said fifth and sixth insulated gate transistors being connected, at one end, to the bit lines of said second pair, respectively, and, at the other end, to the power-supply potential; and
   control means, connected to the gates of the third, fourth, fifth and sixth insulated-gate transistors, for turning off said third, fourth, fifth and sixth insulated-gate transistors in accordance with a plurality of address signals and a plurality of write-enable signals, when data-writing and data-reading with respect to said memory cell conflict with each other.

* * * * *